(12) United States Patent
Tabata et al.

(10) Patent No.: US 8,604,673 B2
(45) Date of Patent: Dec. 10, 2013

(54) POWER GENERATING DEVICE, ELECTRONIC APPARATUS, AND TRANSPORTATION APPARATUS

(75) Inventors: Kunio Tabata, Shiojiri (JP); Atsushi Oshima, Shiojiri (JP); Hiroyuki Yoshino, Suwa (JP); Noritaka Ide, Shiojiri (JP); Atsuya Hirabayashi, Chino (JP)

(73) Assignee: Seiko Epson Corporation, Tokyo (JP)

( * ) Notice: Subject to any disclaimer, the term of this patent is extended or adjusted under 35 U.S.C. 154(b) by 54 days.

(21) Appl. No.: 13/298,999

(22) Filed: Nov. 17, 2011

(65) Prior Publication Data

US 2012/0126666 A1  May 24, 2012

(30) Foreign Application Priority Data

Nov. 18, 2010  (JP) ................................. 2010-257568

(51) Int. Cl.
*H01L 41/08* (2006.01)

(52) U.S. Cl.
USPC .......................................... 310/339; 310/319

(58) Field of Classification Search
USPC ........................................ 310/329, 399, 319
See application file for complete search history.

(56) References Cited

U.S. PATENT DOCUMENTS

| | | | |
|---|---|---|---|
| 5,552,656 A * | 9/1996 | Taylor ............................ | 310/337 |
| 5,801,475 A | 9/1998 | Kimura | |
| 6,252,336 B1 * | 6/2001 | Hall ............................... | 310/339 |
| 6,522,048 B1 * | 2/2003 | Burns et al. ................ | 310/316.01 |
| 7,952,248 B2 | 5/2011 | Ono | |
| 8,026,650 B2 * | 9/2011 | Ramadass et al. ............ | 310/318 |
| 8,368,290 B2 * | 2/2013 | Kwon et al. ................... | 310/339 |
| 8,373,332 B2 * | 2/2013 | Lee ................................ | 310/339 |
| 2010/0102782 A1 * | 4/2010 | Thiesen et al. ............... | 320/166 |
| 2012/0119618 A1 * | 5/2012 | Tabata et al. ................. | 310/319 |
| 2012/0212101 A1 * | 8/2012 | Tabata et al. ................. | 310/319 |
| 2012/0280596 A1 * | 11/2012 | Ide et al. ...................... | 310/319 |

FOREIGN PATENT DOCUMENTS

| | | |
|---|---|---|
| JP | 07-107752 A | 4/1995 |
| JP | 09-182465 A | 7/1997 |
| JP | 11-146663 A | 5/1999 |
| JP | 2002-171341 A | 6/2002 |
| JP | 2003-502000 A | 1/2003 |
| JP | 2005-312269 A | 11/2005 |
| JP | 2010-136542 A | 6/2010 |
| JP | 2010-252509 A | 11/2010 |
| JP | 2011-004598 A | 1/2011 |
| WO | 00/74224 A1 | 7/2000 |

* cited by examiner

*Primary Examiner* — Mark Budd
(74) *Attorney, Agent, or Firm* — Maschoff Brennan (57) ABSTRACT

A power generating device which includes a transformation member that is transformed by receiving a transformation force in a transformation direction, a first piezoelectric device that is disposed on the transformation member, a second piezoelectric device that is disposed on the transformation member, an inductor comprising a resonance circuit including the first piezoelectric device, a switch that is disposed in the resonance circuit, and a control unit that controls the switch to be in a conductive state for a predetermined period by detecting a voltage generated in the second piezoelectric device as the second piezoelectric device is transformed in response to the transformation force being applied to the transformation member.

15 Claims, 9 Drawing Sheets

POWER GENERATING DEVICE, ELECTRONIC APPARATUS, AND TRANSPORTATION APPARATUS

CROSS REFERENCES TO RELATED APPLICATIONS

The entire disclosure of Japanese Patent Application No. 2010-257568, filed Nov. 18, 2010 is expressly incorporated herein by reference.

BACKGROUND

1. Technical Field

The present invention relates to a power generating device that derives electric energy from electric charge which results when a piezoelectric material such as a piezoelectric device receives an external force.

2. Related Art

When a piezoelectric material such as lead zirconate titanate (PZT), crystal (SiO$_2$), or zinc oxide (ZnO) has an external force applied thereto, electric polarization is caused inside the material, and positive and negative electric charge appears on the surface. Such a phenomenon is called a piezoelectric effect. A method of generating power is proposed in which, by using such a property of the piezoelectric material, a cantilever is vibrated so as to repeatedly weight the piezoelectric material, and electric charge generated on the surface of the piezoelectric material is derived as electricity.

For example, by vibrating a metal cantilever which has a spindle arranged at its tip end and to which a thin plate of a piezoelectric material is attached, positive and negative electric charges which are alternately generated in the piezoelectric material in accordance with the vibration can be captured, thereby generating an AC current. A technique is proposed in which such an AC current is rectified by a diode, then is stored in a capacitor, and is captured as electric power (JP-A-7-107752). In addition, a technique is proposed in which a DC current is acquired without incurring a voltage loss in a diode by closing the contact point only while positive charge is generated in the piezoelectric device (JP-A-2005-312269). By using such techniques, the power generating device can be miniaturized. Accordingly, for example, an application of building the power generating device into a small-sized electronic component instead of a battery cell or the like is expected.

However, according to such proposed general techniques, there is a problem that an acquired voltage is limited to the voltage level up to a voltage that is generated in accordance with the electric polarization of the piezoelectric material. Accordingly, in many cases, a booster circuit is necessary in addition to a power generating circuit that derives electricity from the piezoelectric material, and thus there is a problem that it is difficult to decrease the size of the power generating device.

SUMMARY

An advantage of some aspects of the invention is that it provides a technique for generating a high voltage without increasing the size of a power generating device using the piezoelectric effect of a piezoelectric material.

A first aspect of the invention is directed to a power generating device. The device includes a transformation member that is transformed by receiving a transformation force in a transformation direction, a first piezoelectric device that is disposed on the transformation member, a second piezoelectric device that is disposed on the transformation member, an inductor comprising a resonance circuit including the first piezoelectric device, a switch that is disposed in the resonance circuit, and a control unit that controls the switch to be in a conductive state for a predetermined period by detecting a voltage generated in the second piezoelectric device as the second piezoelectric device is transformed in response to the transformation force being applied to the transformation member.

In the above-described power generating device, since the first piezoelectric device and the second piezoelectric device are disposed pn the transformation member, as the transformation member transforms, the first piezoelectric device and the second piezoelectric device transform. As a result, in these piezoelectric devices, positive and negative electric charge is generated based on the piezoelectric effect. In addition, the amount of generation of the electric charge increases as the amount of transformation of the piezoelectric device increases. In addition, the first piezoelectric device configures a resonance circuit together with the inductor, and a switch is disposed in the resonance circuit. When the transformation of the transformation member is started in a state in which the conduction of the switch is cut off, and the amount of transformation has an extreme value (in other words, the direction of the transformation is switched), the switch is allowed to be in the conductive state. The first piezoelectric device (and the second piezoelectric device) is transformed together with the transformation member and generates large amount of electric charge as the amount of transformation increases. Accordingly, when the amount of electric charge generated by the first piezoelectric device (and the second piezoelectric device) is the most, the first piezoelectric device is connected to the inductor so as to form the resonance circuit. Then, the electric charge generated in the first piezoelectric device flow into the inductor. Since the first piezoelectric device and the inductor configures the resonance circuit, the current flowing into the inductor overshoots so as to flow into a terminal disposed on a side opposite to the first piezoelectric device. This period (that is, a period until the electric charge started to flow from one terminal of the first piezoelectric device flows into the first piezoelectric device again from the terminal disposed on the opposite side through the inductor) is a half of the resonance period of the resonance circuit that is formed by the first piezoelectric device and the inductor. Accordingly, when the transformation direction of the first piezoelectric device is switched, the switch is connected so as to form the resonance circuit, and thereafter, when a time of a half the resonance period elapses, the switch is cut off, whereby the arrangement of positive and negative charge generated inside the first piezoelectric device before connection of the inductor can be reversed. From the state, this time, when the transformation member is transformed in the opposite direction, the first piezoelectric device is transformed in the opposite direction, and, from the state in which the arrangement of the positive and negative charge is reversed, new electric charge newly generated based on the piezoelectric effect further increases, and the electric charge is accumulated in the first piezoelectric device. In addition, as the electric charge is accumulated inside the first piezoelectric device, the generated voltage increases. Accordingly, a voltage that is higher than a voltage generated due to electric polarization of a piezoelectric material composing the first piezoelectric device can be generated without separately arranging a booster circuit. Furthermore, in order to efficiently accumulate electric charge inside the first piezoelectric device as above, it is important to connect the switch and form a resonance circuit when the transformation direction of the first piezoelectric device is switched. Here, since the first piezoelectric device and the second piezoelectric device are disposed on the transformation member, when the transformation direction of the first piezoelectric device is switched, the transformation direction of the second piezoelectric device is switched as well. The second piezoelectric device generates a higher voltage as the amount of transformation increases, and the voltage generated by the second piezoelectric device has an extreme value when the transformation direction of the second piezoelectric device is switched. Therefore, the voltage generated in the second piezoelectric device is detected, and the switch is in the conductive state only in a predetermined period from the time point at which the voltage has the extreme value, whereby the electric charge can be efficiently accumulated inside the first piezoelectric device.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, in order to clarify the content of the invention, embodiments will be described in the following order.

Figure 1A:
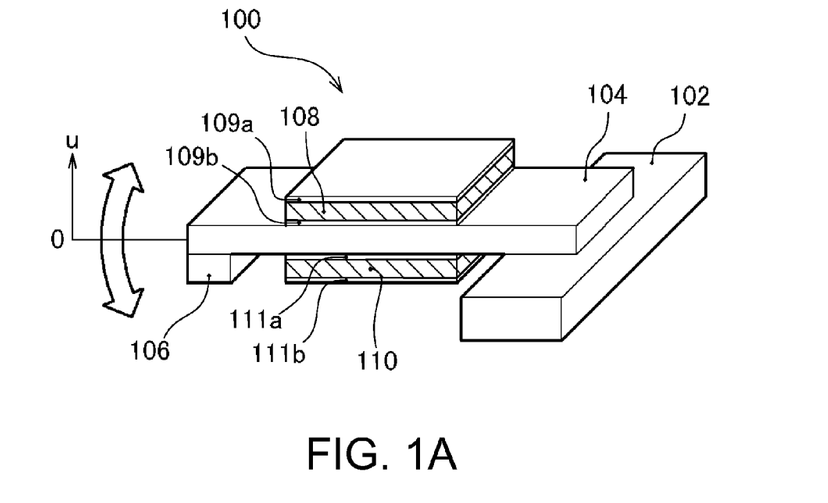
FIGS. 1A and 1B are explanatory diagrams illustrating the structure of a power generating device according to a first embodiment.
Figure 1B:
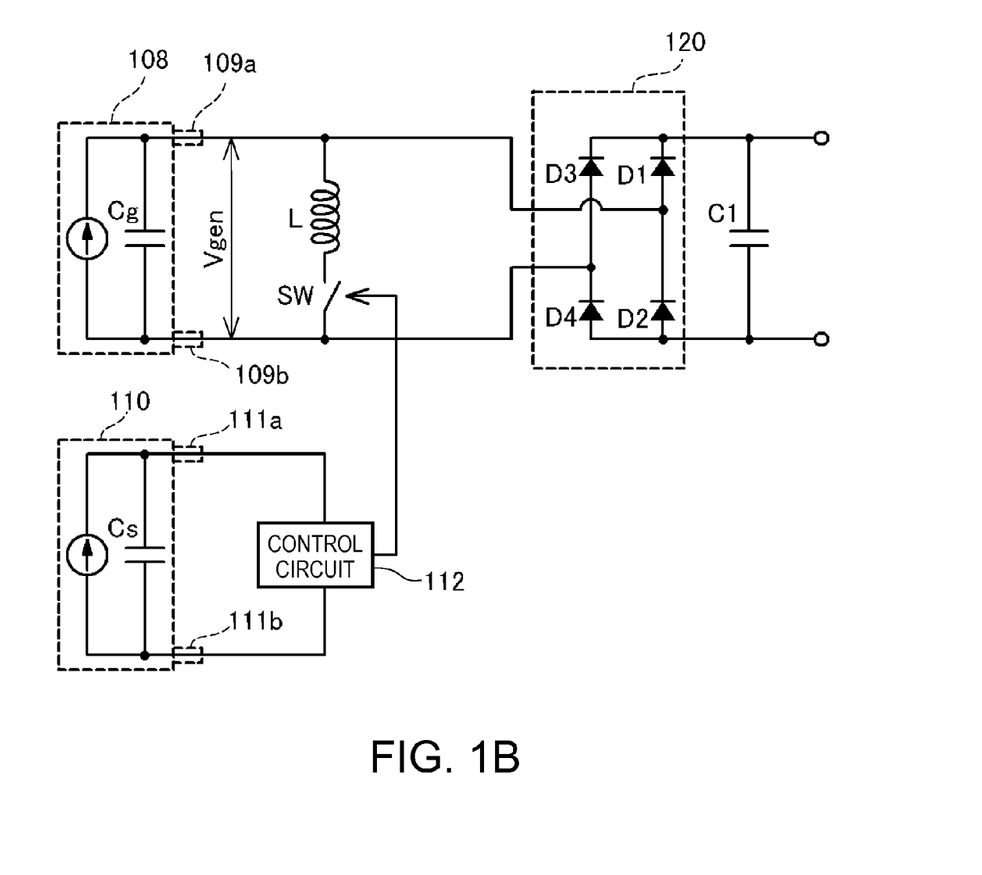

A. First Embodiment
A-1. Structure of Power Generating Device According to First Embodiment
A-2. Operation of Power Generating Device According to First Embodiment
A-3. Principle of Operation of Power Generating Device According to First Embodiment
A-4. Switch Switching Timing According to First Embodiment
B. Second Embodiment
C. Alternative embodiments
C-1. First Alternative embodiment
C-2. Second Alternative embodiment
C-3. Third Alternative embodiment A. First Embodiment A-1. Structure of Power Generating Device According to First Embodiment FIGS. 1A and 1B are explanatory diagrams illustrating the structure of a power generating device 100 according to a first embodiment. FIG. 1A shows the mechanical structure of the power generating device 100, and FIG. 1B shows the electrical configuration thereof. As the mechanical structure of the power generating device 100 according to the first embodiment, a structure is formed in which a crossbeam 104 having a spindle 106 disposed at the tip end is fixed to a support end 102 on the base end side. On the surface of the crossbeam 104, a piezoelectric device 108 and a piezoelectric device 110 that are formed from a piezoelectric material such as lead zirconate titanium (PZT) are disposed. In addition, on the surface of the piezoelectric device 108, an upper electrode 109a and a lower electrode 109b are disposed. The upper electrode 109a and the lower electrode 109b are formed by a metal foil. Similarly, on the piezoelectric device 110, an upper electrode 111a and a lower electrode 111b are formed. The upper electrode 111a and lower electrode 111b are also formed by a metal foil. In the example shown in FIG. 1A, although the shapes of the piezoelectric device 108 and the piezoelectric device 110 are the same, the shapes thereof may not be the same. For example, in a case where the piezoelectric device 108 has a maximum length and a maximum width for which it can be disposed in the crossbeam 104, the amount of power generation of the piezoelectric device 108 is large. On the other hand, in a case where the piezoelectric device 110 has a minimum installable width (the length of the crossbeam 104 in the direction of a shorter side), the displacement resistance of the crossbeam 104 decreases owing to the piezoelectric device 110, whereby the power generating efficiency is improved. In addition, since the piezoelectric device 108 and the piezoelectric device 110 are transformed or subject to deformation in accordance with the transformation of the crossbeam 104, the crossbeam 104 corresponds to a "transformation member" according to an embodiment of the invention.

In the crossbeam 104, the base end side is fixed to the support end 102, and the spindle 106 is disposed on the tip end side. Accordingly, by adding vibration thereto or moving the power generating device 100, as denoted by a white arrow in the figure, the tip end of the crossbeam 104 greatly vibrates. As a result, a compressional force and a tensile force are alternately applied to the piezoelectric device 108 and the piezoelectric device 110, which are each attached to the surface of the crossbeam 104. Then, the piezoelectric devices 108 and 110 generate positive and negative electric charge based on the piezoelectric effect, and the electric charge appears in the upper electrodes 109a and 111a and the lower electrodes 109b and 111b.

FIG. 1B shows the circuit diagram of the power generating device 100 according to this embodiment. The piezoelectric device 108 can be electrically represented as a current source and a capacitor Cg that stores electric charge. Similarly, the piezoelectric device 110 can be represented as a current source and a capacitor Cs that stores electric charge. An inductor L is connected to the piezoelectric device 108 in parallel and forms an electric resonance circuit together with a capacitive component of the piezoelectric device 108. A switch SW used for turning On/Off the resonance circuit is disposed inside the resonance circuit (in series with the inductor L). The turning On/Off of the switch SW is controlled by a control circuit 112 (corresponding to a control unit). In addition, the upper electrode 109a and the lower electrode 109b disposed in the piezoelectric device 108 are connected to a full-wave rectifier circuit 120 that is configured by four diodes D1 to D4. A capacitor (an output capacitor C1) that stores a current after rectification is connected to the full-wave rectifier circuit 120.

On the other hand, the piezoelectric device 110 is disposed so as to control the switch SW and the upper electrode 111a and the lower electrode 111b disposed in the piezoelectric device 110 are connected to the control circuit 112. Thus, hereinafter, the piezoelectric device 108 may be referred to as a "power generating piezoelectric device", and the piezoelectric device 110 may be referred to as a "control piezoelectric device". The piezoelectric device 108 corresponds to a "first piezoelectric device" according to an embodiment of the invention, and the piezoelectric device 110 corresponds to a "second piezoelectric device" according to an embodiment of the invention.

A-2. Operation of Power Generating Device According to First Embodiment

Figure 2A:
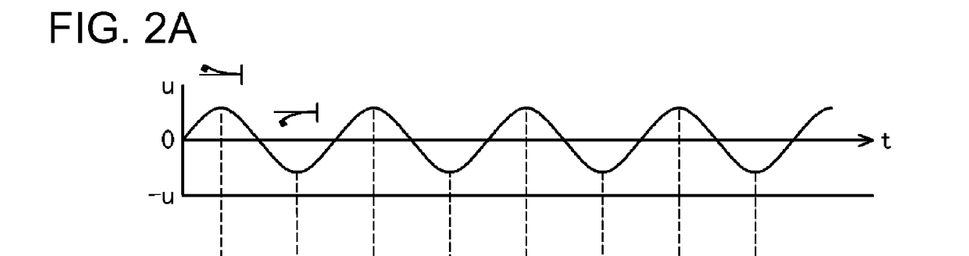
FIGS. 2A to 2D are explanatory diagrams illustrating the operation of the power generating device according to the first embodiment.
Figure 2B:
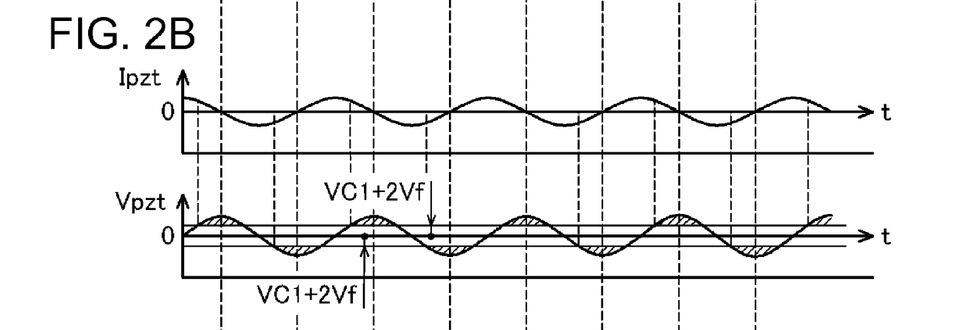

FIGS. 2A to 2D are explanatory diagrams illustrating the operation of the power generating device 100 according to the first embodiment. FIG. 2A illustrates the appearance of changing in the displacement u of the tip end of the crossbeam 104 in accordance with the vibration of the crossbeam 104. A positive displacement (+u) represents a state in which the crossbeam 104 is in an upwardly warped shape (a state in which the top face side of the crossbeam 104 is indented), and a negative displacement (−u) represents that the crossbeam 104 is in a downwardly warped state (a state in which the bottom face of the crossbeam 104 is indented). FIG. 2B illustrates the appearance of a current generated by the piezoelectric device 108 in accordance with the transformation of the crossbeam 104 and a resultant electromotive force generated inside the piezoelectric device 108. In FIG. 2B, the appearance of the generation of electric charge in the piezoelectric device 108 is represented as the amount of electric charge generated per unit time (that is, a current Ipzt), and the electromotive force generated in the piezoelectric device 108 is represented by an electric potential difference Vpzt generated between the upper electrode 109a and the lower electrode 109b.

As described above with reference to FIGS. 1A and 1B, the piezoelectric device 110 is disposed in the crossbeam 104 as well, and, when the crossbeam 104 is transformed, the piezoelectric device 110 and the piezoelectric device 108 are subsequently deformed. Accordingly, inside the piezoelectric device 110, similarly to the piezoelectric device 108, the current Ipzt and the electric potential difference Vpzt shown in FIG. 2B are generated.

As shown in FIGS. 2A and 2B, while the displacement of the crossbeam 104 increases, the piezoelectric device 108 generates a current (in other words, a positive value of the current Ipzt) in the positive direction, and the electric potential difference Vpzt between the upper electrode 109a and the lower electrode 109b increases in the positive direction accordingly. When the electric potential difference Vpzt in the positive direction is larger than a sum of the voltage VC1 of the output capacitor C1 and twice the forward drop voltage Vf of the diode configuring the full-wave rectifier circuit 120, that is, VC1+2Vf, electric charge generated thereafter can be derived as a DC current and be stored in the output capacitor C1. On the other hand, while the displacement of the crossbeam 104 decreases, the piezoelectric device 108 generates a current (in other words, a negative value of the current Ipzt) in the negative direction, and the electric potential difference Vpzt between the upper electrode 109a and the lower electrode 109b increases in the negative direction accordingly. When the electric potential difference Vpzt in the negative direction is larger than a sum of the voltage VC1 and twice the forward drop voltage 2Vf of the full-wave rectifier circuit 120, generated electric charge can be derived as a DC current and be stored in the output capacitor C1. In other words, even in a state in which the switch SW shown in FIGS. 1A and 1B is turned off, for a portion denoted by applying diagonal lines thereto in FIG. 2B, electric charge can be stored in the output capacitor C1.

Figure 2C:
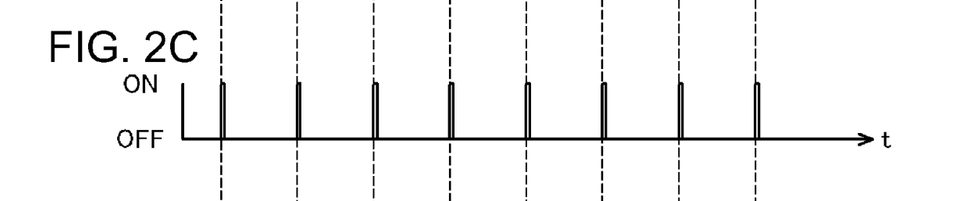
Figure 2D:
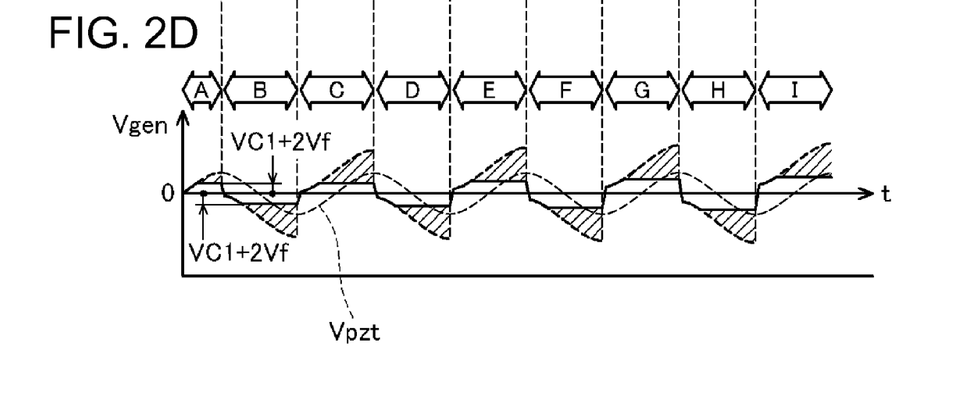

In the power generating device 100 according to the first embodiment, the switch SW is turned on at the timing as shown in FIG. 2C. Then, as shown in FIG. 2D, a phenomenon occurs in which the voltage waveform between the terminals of piezoelectric device 108 is shifted at the moment the switch SW is turned on. For example, in a period B denoted by "B" in FIG. 2D, a voltage waveform denoted by a thick broken line that is acquired by shifting a voltage waveform Vpzt, which is denoted by a thin broken line, corresponding to the electromotive force of the piezoelectric device 108 in the negative direction appears between the terminals of the piezoelectric device 108. The reason for the occurrence of such a phenomenon will be described more fully below. In addition, in a period C denoted by "C" in the FIG. 2D, a voltage waveform, which is denoted by a thick broken line, acquired by shifting the voltage waveform Vpzt corresponding to the electromotive force of the piezoelectric device 108 in the positive direction appears. In the following periods D, E, and F, and the like, similarly, a voltage waveform denoted by a thick broken line that is acquired by shifting the voltage waveform Vpzt corresponding to the electromotive force of the piezoelectric device 108 in the positive direction or the negative direction appears. For a portion in which the shifted voltage waveform exceeds the sum of VC1 and 2Vf (a portion denoted by applying diagonal lines thereto in FIG. 2D), the electric charge generated by the piezoelectric device 108 can be stored in the output capacitor C1. As the electric charge flows from the piezoelectric device 108 to the output capacitor C1, consequently, the voltage between the terminals of the piezoelectric device 108 is truncated to a voltage equal to a sum of VC1 and 2Vf. In other words, the voltage between the terminals of the piezoelectric device 108 is maintained to a voltage of a sum of VC1 and 2Vf. As a result, the voltage waveform between the upper electrode 109a and the lower electrode 109b is a waveform denoted by a thick solid line in FIG. 2D.

As is apparent by comparing a case shown in FIG. 2B where the switch SW is maintained to be turned off and a case shown in FIG. 2D where the switch SW is turned on at the timing the transformation direction of the crossbeam 104 is switched, according to the power generating device 100 of the first embodiment, by turning the switch SW on at appropriate timing, electric charge can be efficiently stored in the output capacitor C1. Thus, in the power generating device 100 of the first embodiment, in order to turn the switch SW on at appropriate timing, the control piezoelectric device 110 is disposed and controls the switch SW by detecting the voltage of the piezoelectric device 110. This point will be described in greater detail below.

In the output capacitor C1, electric charge can be stored, and as the inter-terminal voltage of the output capacitor C1 increases, the amount of shift of the voltage waveform increases in accordance therewith. For example, when period B (a state in which electric charge is not stored in the output capacitor C1) shown in FIG. 2D and period H (a state in which a small amount of electric charge is stored in the output capacitor C1) shown in FIG. 2D are compared, the amount of shift of the voltage waveform in period H is larger than that in period B. Similarly, when period C and period I shown in FIG. 2D are compared, the amount of shift of the voltage waveform in period I in which the amount of electric charge stored in the output capacitor C1 increases is larger than that in period C. The reason for the occurrence of such a phenomenon will be described later. As a result, according to the power generating device 100 of this embodiment, by transforming the piezoelectric device 108, a voltage that is higher than the voltage Vpzt generated between the upper electrode 109a and the lower electrode 109b can be stored in the output capacitor C1. Consequently, a special booster circuit does not need to be included, and accordingly, a high-efficiency small-size power generating device can be acquired.

Figure 3A:
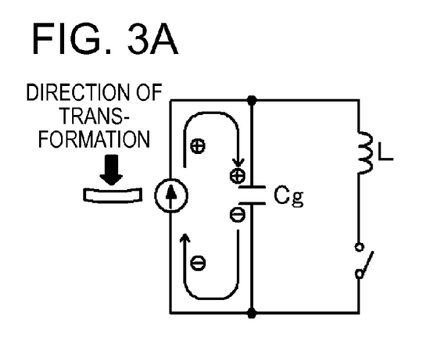
FIGS. 3A to 3F are explanatory diagrams conceptually illustrating a first half part of the principle of the operation of the power generating device according to the first embodiment.
Figure 3B:
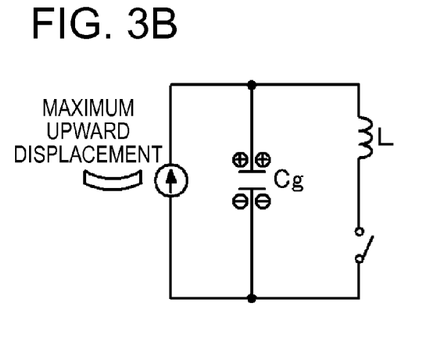

A-3. Principle of Operation of Power Generating Device According to First Embodiment FIGS. 3A to 3F are explanatory diagrams conceptually illustrating a first half part of the principle of the operation of the power generating device 100 according to the first embodiment. FIGS. 4A to 4F are explanatory diagrams conceptually illustrating a second half part of the principle of the operation of the power generating device 100 according to the first embodiment. In FIGS. 3A to 3F and FIGS. 4A to 4F, the movement of electric charge inside Cg (a capacitive component of the piezoelectric device 108) at the time when the switch SW is turned on in accordance with the transformation of the piezoelectric device 108 is conceptually illustrated. FIG. 3A shows a state in which the piezoelectric device 108 (more precisely, the crossbeam 104) is upwardly transformed (the upper face side is concave). When the piezoelectric device 108 is upwardly transformed, a current flows in the positive direction from a current source, and accordingly, electric charge is stored in Cg (the capacitive component of the piezoelectric device 108), thereby generating a voltage Vgen in the positive direction. The voltage value increases as the amount of transformation of the piezoelectric device 108 increases. Then, the switch SW is turned on at the timing the amount of transformation of the piezoelectric device 108 becomes an extreme value (timing the amount of electric charge becomes an extreme value (see FIG. 3B)).

Figure 3C:
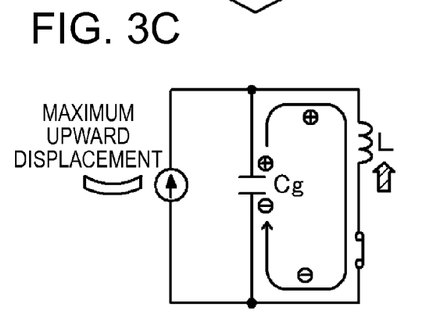

FIG. 3C shows a state immediately after the switch SW is turned on. In Cg (the capacitive component of the piezoelectric device 108), electric charge is stored, and accordingly, the electric charge tends to flow through the inductor L. When a current flows through the inductor L, a magnetic flux is generated (a magnetic flux increases), and the inductor L has a property (self-induction action) of generating a counter electromotive force in a direction hindering a change in the magnetic flux passing through it. At the moment the switch SW is turned on, the magnetic flux tends to increase due to flow of electric charge, and a counter electromotive force is generated in a direction (in other words, a direction hindering the flow of electric charge) hindering an increase in the magnetic flux. The magnitude of the counter electromotive force is in proportion to the speed of change in the magnetic flux (the amount of change per unit time). In FIG. 3C, the counter electromotive force generated in the inductor L as above is represented by an arrow to which hatching is applied. Since such an electromotive force is generated, even when the switch SW is turned on, only little electric charge of the piezoelectric device 108 starts to flow. In other words, the current flowing through the inductor L increases little.

Figure 3D:
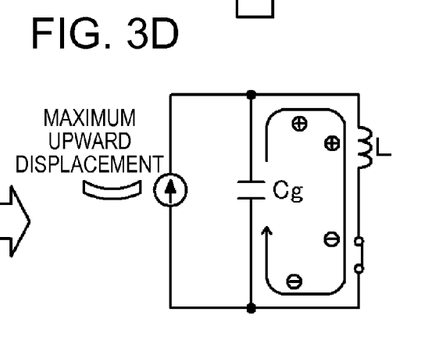
Figure 3E:
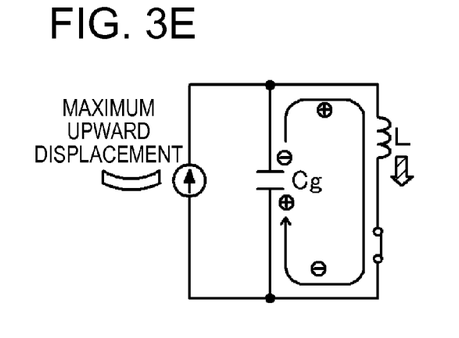
Figure 3F:
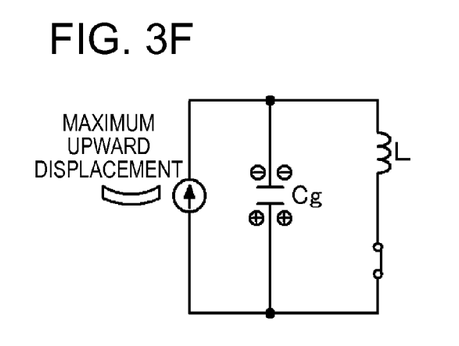

Thereafter, when the current flowing through the inductor L reaches its peak, the speed of change in the magnetic flux becomes "0", and as shown in FIG. 3D, the counter electromotive force becomes "0". Then, in turn, the current starts to decrease. Then, since the magnetic flux passing through the inductor L decreases, an electromotive force is generated in the inductor L in a direction (a direction allowing the current to flow) hindering the decrease in the magnetic flux (see FIG. 3E). As a result, while electric charge is drawn out from Cg (the capacitive component of the piezoelectric device 108), a current continuously flows through the inductor L. In a case where there is no loss in the middle of the movement of electric charge, all the electric charge generated in accordance with the transformation of the piezoelectric device 108 is distributed, and a state (in other words, a state is formed in which positive electric charge is distributed on the lower face side of the piezoelectric device 108 and negative electric charge is distributed on the upper face side thereof) is formed in which the positive charge and the negative charge are distributed. FIG. 3F shows a state in which all the positive and negative charge generated in accordance with the transformation of the piezoelectric device 108 is distributed.

In this state, when the switch SW is maintained to be turned on, this time, a phenomenon opposite to the description presented above occurs. In other words, positive charge disposed on the lower face side of the piezoelectric device 108 tends to flow through the inductor L, and at this time, a counter electromotive force is generated in the inductor L in a direction hindering the flow of the electric charge. Thereafter, after the current flowing through the inductor L reaches its peak and then decreases, at this time, an electromotive force in a direction (a direction allowing the current to continuously flow) hindering the decrease in the current is generated in the inductor L. A result, a state is formed in which all the positive charge disposed on the lower face side of the piezoelectric device 108 moves to the upper face side (the state shown in FIG. 3B). The positive charge which has been returned to the upper face side of the piezoelectric device 108 move to the lower face side again as described with reference to FIGS. 3B to 3F.

As above, when the switch SW is turned on in a state in which electric charge is stored in Cg (the capacitive component of the piezoelectric device 108), and the state is maintained, a type of resonance phenomenon occurs in which the direction of the current alternately inverts between the piezoelectric device 108 and the inductor L. The period of this resonance phenomenon is the period T of a so-called resonance circuit, and thus, when the magnitude of Cg (the capacitive component of the piezoelectric device 108) is C, and the magnitude (inductance) of the inductive element of the inductor L is L, the period T is given as $T=2\pi(LC)^{0.5}$. Accordingly, a time from immediately after the switch SW is turned on (the state as shown in FIG. 3C) to a time the state as shown in FIG. 3F is formed is T/2.

Figure 4A:
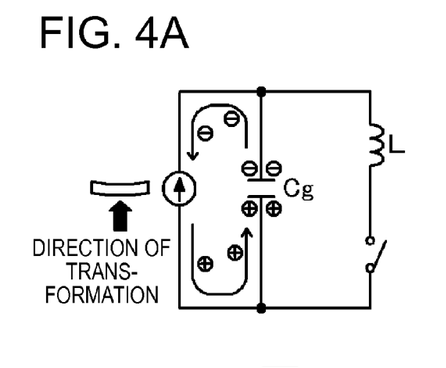
FIGS. 4A to 4F are explanatory diagrams conceptually illustrating a second half part of the principle of the operation of the power generating device according to the first embodiment.
Figure 4B:
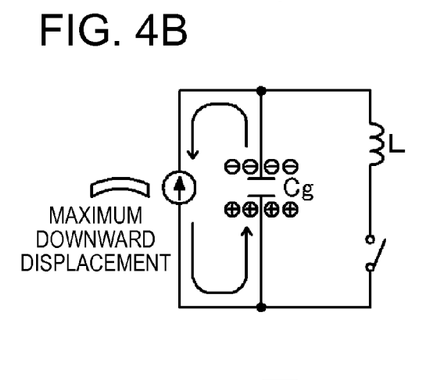
Figure 4C:
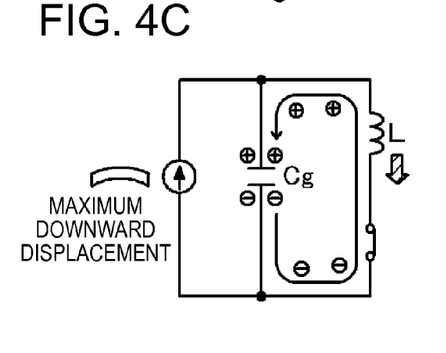
Figure 4D:
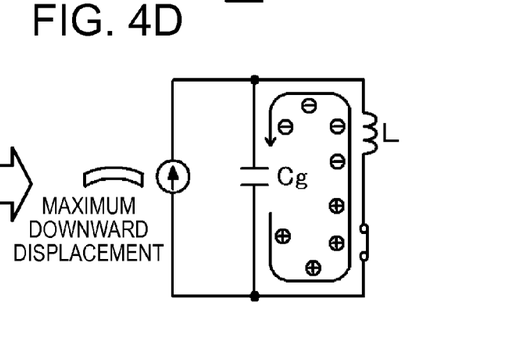
Figure 4E:
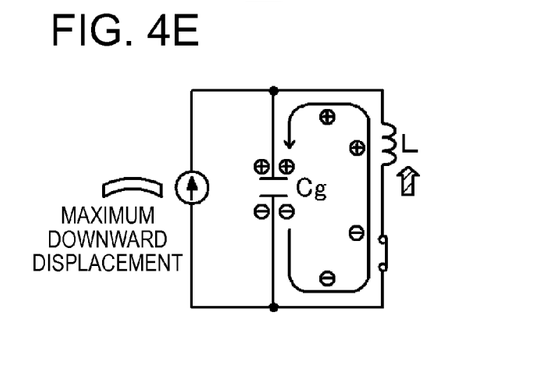
Figure 4F:
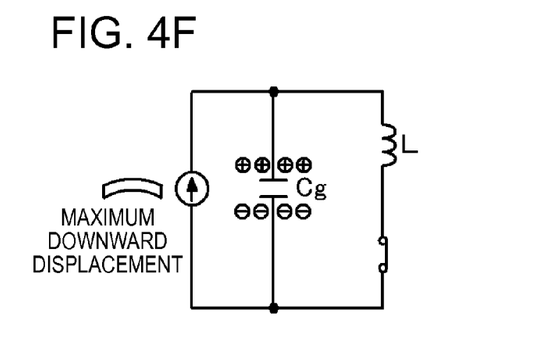

Thus, at a time point when a time T/2 elapses after the switch SW is turned on, as shown in FIG. 4A, the switch SW is turned off. Then, from this state, the piezoelectric device 108 (more precisely the crossbeam 104) is downwardly transformed in turn (the lower side is indented). In FIG. 3A described above, although the piezoelectric device 108 is upwardly transformed, in FIG. 4A, the piezoelectric device is downwardly transformed. Accordingly, a current in the negative direction flows from the current source, and electric charge is accumulated in Cg so as to increase Vgen in the negative direction. As described above with reference to FIGS. 3A to 3F, in a stage before the piezoelectric device 108 (more precisely, the crossbeam 104) is downwardly transformed, positive charge is distributed on the lower face side of the piezoelectric device 108, and negative charge is distributed on the upper face side. Accordingly, in addition to the electric charge, new positive charge is accumulated on the lower face side, and new negative charge is accumulated on the upper face side. In FIG. 4B, a state is shown in which new electric charge is accumulated in the piezoelectric device 108 by transforming the piezoelectric device 108 (more precisely, the crossbeam 104) in the state in which the switch SW is turned off.

When the switch SW is turned on at the timing (the timing at which the amount of electric charge becomes an extreme value) at which the amount of transformation of the piezoelectric device 108 becomes the extreme value, the positive charge accumulated on the lower face side of the piezoelectric device 108 tends to flow through the inductor L. At this time, since a counter electromotive force is generated in the inductor L (see FIG. 4C), the current start to flow a little, then reaches its peak, and decreases thereafter. Then, an electromotive force is generated in a direction hindering the decrease in the current (the direction allowing the current to continuously flow) in the inductor L (see FIG. 4E), the current continuously flows in accordance with the electromotive force, and finally, a state is formed in which all the positive charge distributed on the lower face side of the piezoelectric device 108 moves to the upper face side, and all the negative charge distributed on the upper face side moves to the lower face side (see FIG. 4F). In addition, a time required for moving all the positive charge disposed on the lower face side to the upper face side and moving all the negative charge disposed on the upper face side to the lower face side is a time T/2 corresponding to a half period of the LC resonance circuit. Thus, when the time T/2 elapses after the switch SW is turned on, the switch SW is turned off, and, at this time, in a case where the piezoelectric device 108 (more precisely, the crossbeam 104) is upwardly transformed (the upper face side is indented), the positive and negative electric charge can be accumulated further inside the piezoelectric device 108.

As described above, according to the power generating device 100 of this embodiment, after electric charge is generated by transforming the piezoelectric device 108, the piezoelectric device 108 is connected to the inductor L, and a resonance circuit is formed during a half period of the resonance period, whereby the distribution of the positive and negative electric charge is inverted inside the piezoelectric device 108. Thereafter, the piezoelectric device 108 is transformed in the opposite direction so as to generate new electric charge. Since the distribution of the positive and negative electric charge is inverted inside the piezoelectric device 108, the electric charge that is newly developed is accumulated in the piezoelectric device 108. Thereafter, again, the piezoelectric device 108 is connected to the inductor only for half the resonance period, the distribution of the positive and negative charge is inverted inside the piezoelectric device 108, and then the piezoelectric device 108 is transformed in the opposite direction. By repeating such an operation, each time the piezoelectric device 108 is repeatedly transformed, the electric charge accumulated in the piezoelectric device 108 can be increased.

As described with reference to FIGS. 2A to 2D, in the power generating device 100 of this embodiment, a phenomenon occurs in which the voltage waveform between terminals of the piezoelectric device 108 is shifted each time the switch SW is turned on, and such a phenomenon occurs through the above-described mechanism. In other words, for example, in period A shown in FIG. 2D, although a voltage is generated between the upper electrode 109a and the lower electrode 109b in accordance with the transformation of the piezoelectric device 108 (more precisely, the crossbeam 104), the upper electrode 109a and the lower electrode 109b are connected to the full-wave rectifier circuit 120, and accordingly, the electric charge exceeding a voltage corresponding to a sum of VC1 and 2Vf flow into the output capacitor C1 that is connected to the full-wave rectifier circuit 120. As a result, when the switch SW is turned on at a time point at which the amount of transformation of the crossbeam 104 has an extreme value, the positive and negative charge remaining inside the piezoelectric device 108 at that time moves through the inductor L, whereby the arrangement of the positive and negative charge inside the piezoelectric device 108 is interchanged. As is apparent from the mechanism described with reference to FIGS. 3A to 4F, the period in which the switch SW is turned on is a time corresponding to a half of the resonance period of the resonance circuit that is configured by the capacitive component of the piezoelectric device 108 and the inductor L.

When the crossbeam 104 is transformed in the opposite direction from the state in which the arrangement of the positive and negative electric charge is interchanged, a voltage waveform appears between the upper electrode 109a and the lower electrode 109b of the piezoelectric device 108 based on the piezoelectric effect. In other words, from the state in which the polarities of the upper electrode 109a and the lower electrode 109b of the piezoelectric device 108 are interchanged, a voltage change occurs due to the transformation of the piezoelectric device 108. As a result, in period B shown in FIG. 2D, a voltage waveform acquired by shifting the voltage waveform generated in the piezoelectric device 108 in accordance with the transformation of the crossbeam 104 appears. Above all, as described above, the electric charge exceeding the voltage corresponding to a sum of VC1 and 2Vf flows into the output capacitor C1, and accordingly, the voltage between the upper electrode 109a and the lower electrode 109b of the piezoelectric device 108 is truncated to the voltage of the sum of VC1 and 2Vf. Thereafter, when the switch SW is turned on for a time corresponding to a half of the resonance period, the arrangement of the positive and negative charge remaining in the piezoelectric device 108 is interchanged. Then, as the crossbeam 104 is transformed from that state, a voltage waveform based on the piezoelectric effect appears in the piezoelectric device 108. Accordingly, also in period C shown in FIG. 2D, a voltage waveform acquired by shifting the voltage waveform generated in accordance with the transformation of the crossbeam 104 appears.

In addition, as described above with reference to FIGS. 2A to 2D, in the power generating device 100 of this embodiment, while the transformation of the crossbeam 104 is repeated, a phenomenon occurs in which the amount of the shift of the voltage waveform gradually increases. Accordingly, a remarkable advantage that a voltage higher than the electric potential difference generated between the upper electrode 109a and the lower electrode 109b can be stored in the output capacitor C1 based on the piezoelectric effect of the piezoelectric device 108 can be acquired. Such a phenomenon occurs through the following mechanism.

First, as illustrated in period A or B shown in FIG. 2D, in a case where the output capacitor C1 is not charged, when the voltage generated between the terminals of the piezoelectric device 108 exceeds 2Vf of the full-wave rectifier circuit 120, electric charge flows into the output capacitor C1 from the piezoelectric device 108, and the voltage appearing between the terminals of the piezoelectric device 108 is clipped to 2Vf. However, the voltage between the terminals of the output capacitor C1 increases in accordance with the accumulation of electric charge in the output capacitor C1 as above. Thereafter, the electric charge does not flow into from the piezoelectric device 108 until the inter-terminal voltage of the output capacitor C1 becomes a voltage higher than the sum of VC1 and 2Vf. Accordingly, the value at which the inter-terminal voltage of the piezoelectric device 108 is clipped gradually increases in accordance with the accumulation of electric charge in the output capacitor C1.

In addition, as described above with reference with FIGS. 3A to 4F, so long as electric charge is not allowed to flow out of the piezoelectric device 108, each time the piezoelectric device 108 (more precisely, the crossbeam 104) is transformed, the electric charge disposed inside the piezoelectric device 108 increases, and the inter-terminal voltage of the piezoelectric device 108 increases. Therefore, according to the power generating device 100 of this embodiment, power can be generated in a state in which the voltage is naturally raised up to a voltage level necessary for driving an electric load without requiring a special booster circuit.

A-4. Switch Switching Timing According to First Embodiment

As described above, in the power generating device 100 of the first embodiment, repetitive transformation is applied to the piezoelectric device 108 (more precisely, the crossbeam 104), at the moment at which the transformation direction is switched, the piezoelectric device 108 is connected to the inductor L only for a time corresponding to a half of the resonance period, and accordingly, the efficiency is improved. In addition, since the booster circuit is not necessary, a superior advantage that the size of the device can be decreased in an easy manner can be acquired. Above all, it is not so easy to turn the switch SW on at the moment at which the transformation direction of the crossbeam 104 is switched. For example, the moment at which the transformation direction of the crossbeam 104 is switched is considered as a moment at which the magnitude of the displacement of the crossbeam 104 is the maximum, the switch may be configured so as to be tuned on at the moment at which the crossbeam 104 is at the maximum displacement by using a mechanical contact point. However, in a case where the adjustment of the contact point is mismatched, the efficiency greatly decreases. Thus, in the power generating device 100 of the first embodiment, not only the power generation piezoelectric device 108 but also the control piezoelectric device 110 are arranged, and the switch SW is controlled by detecting the voltage generated by the piezoelectric device 110.

Figure 5A:
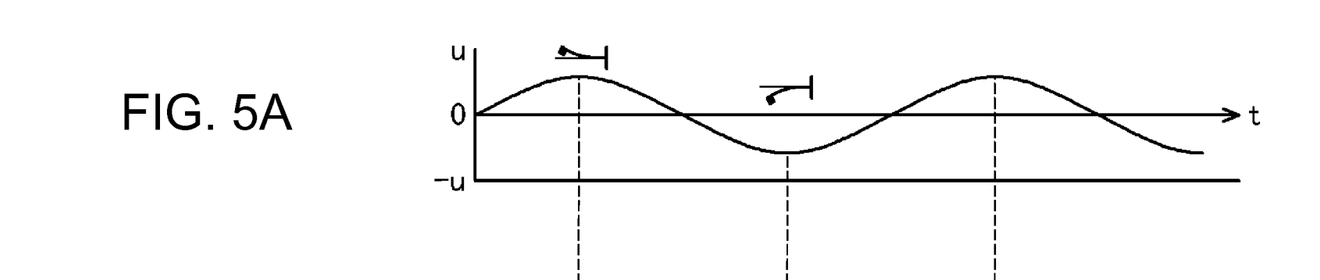
FIGS. 5A to 5C are explanatory diagrams illustrating a reason that a switch can be controlled at appropriate timing by detecting the voltage of a control piezoelectric device.
Figure 5B:
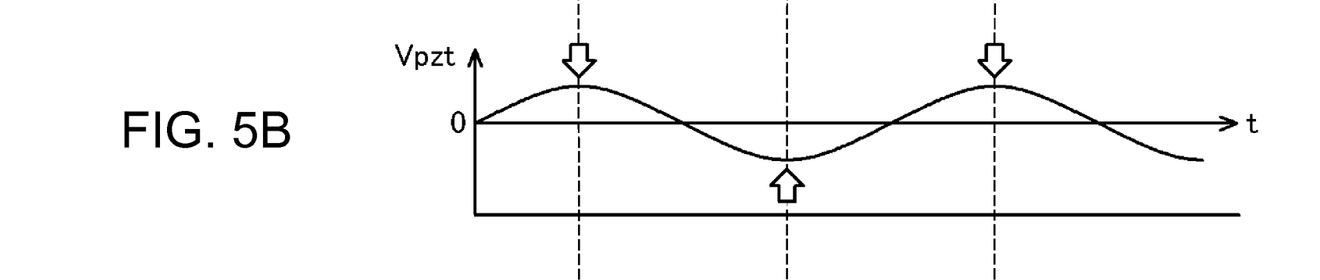
Figure 5C:
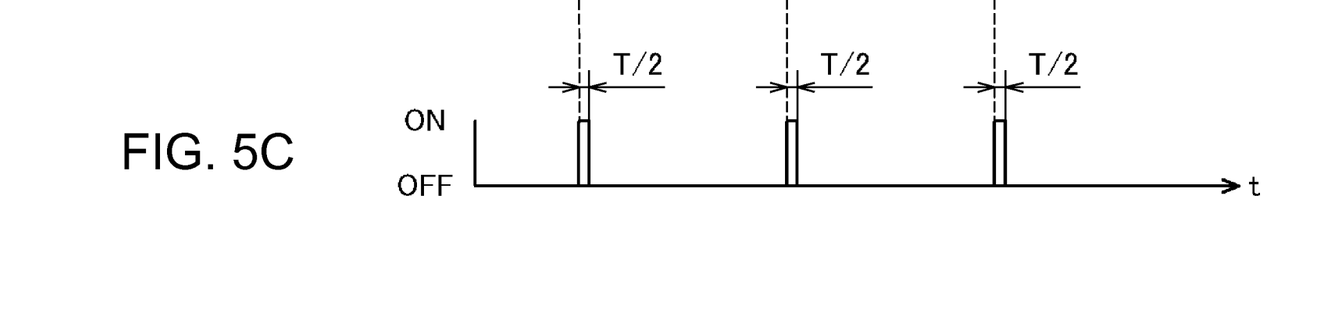

FIGS. 5A to 5C are explanatory diagrams illustrating a reason that a switch SW can be controlled at appropriate timing by detecting the voltage generated in the control piezoelectric device 110. FIG. 5A shows the displacement of the crossbeam 104. FIG. 5B shows the appearance of a change in the electromotive force Vpzt generated in the piezoelectric device 110 in accordance with the vibration of the crossbeam 104.

As described above with reference to FIGS. 3A to 4F, power can be generated most efficiently in a case where the switch SW is turned on at timing at which the displacement u of the crossbeam 104 reaches the extreme value. As is apparent from comparison between FIGS. 5A and 5B, the timing at which the displacement u of the crossbeam 104 has an extreme value coincides with the timing at which the electromotive force Vpzt of the piezoelectric device 110 has an extreme value. The reason for this is as follows. First, even in a case where electric charge is generated in accordance with the transformation of the piezoelectric device 108, the electric charge is drawn out by the inductor L, or the electric charge flows through the output capacitor C1, whereby the electromotive force Vpzt of the piezoelectric device 108 does not completely coincide with the displacement of the crossbeam 104. In contrast to this, since the piezoelectric device 110 is not connected to the inductor L or the output capacitor C1, an increase or decrease in the electric charge is directly reflected on the change in the electromotive force Vpzt of the piezoelectric device 110. Accordingly, the timing at which the electromotive force Vpzt of the piezoelectric device 110 has an extreme value coincides with the timing at which the displacement u of the crossbeam 104 has an extreme value.

Thus, as denoted by an arrow shown in FIG. 5B, the timing at which the electromotive force Vpzt of the piezoelectric device 110 has an extreme value is detected, and the switch SW is turned on for a time (T/2) corresponding to half the resonance period described above from the timing, whereby power can be efficiently generated.

Figure 6:
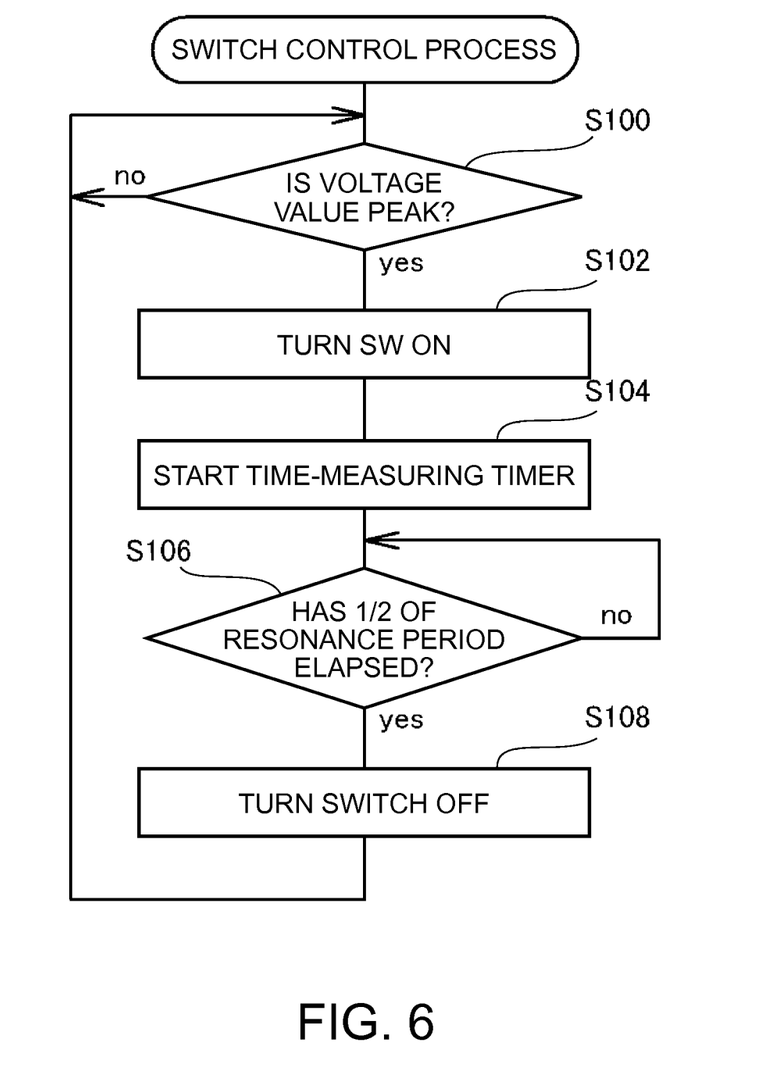
FIG. 6 is a flowchart illustrating a switching control process of turning a switch to be turned On or Off by detecting the electromotive force of the control piezoelectric device.

FIG. 6 is a flowchart illustrating a switching control process of turning the switch SW to be turned On or Off by detecting the electromotive force of the control piezoelectric device 110. This process is performed by a CPU that is built in the control circuit 112.

When the switch control process is started, the CPU of the control circuit 112 detects a voltage between the upper electrode 111a and the lower electrode 111b of the control piezoelectric device 110 and determines whether or not the voltage value has reached its peak (in other words, whether or not the voltage value reaches an extreme value) (in Step S100). The determining whether or not the voltage value has reached its peak may be performed by calculating the differential of the voltage waveform and determining that the voltage value has reached its peak in a case where the sign of the value of differential changes.

Alternatively, since the amplitude of the displacement of the crossbeam 104 is considered to be almost constant, the voltage generated by the control piezoelectric device 110 is considered to be almost the same. Accordingly, a maximum voltage value Vmax and a minimum voltage value Vmin are stored, and the voltage generated by the piezoelectric device 110 is compared with the maximum voltage value Vmax and the minimum voltage value Vmin. In a case where the voltage generated by the piezoelectric device 110 is over the maximum voltage value Vmax or below the minimum voltage value Vmin, it may be determined that the voltage value reaches the peak. Since the crossbeam 104 is not regarded to be transformed with the exactly same amplitude, it cannot be determined that the amplitude of the voltage generated by the piezoelectric device 110 is exactly the same. However, even in such a case, by setting the maximum voltage value Vmax to a slightly lower value and setting Vmin to a slightly higher value, even in a case where there is a small variation in the amplitude of the crossbeam 104, the reach of the peak of the voltage value can be detected with sufficient accuracy.

When the peak of the voltage value generated by the control piezoelectric device 110 is detected being at its peak (S100: Yes), the switch SW of the resonance circuit (a resonance circuit configured by the capacitance component Cg of the piezoelectric device 108 and the inductor L) is turned on (Step S102), and then, a time measuring timer, which is not shown in the figure, built in the control circuit 112 is started (Step S104). Then, it is determined whether or not a time corresponding to ½ of the resonance period of the resonance circuit that is configured by the capacitive component Cg of the piezoelectric device 108 and the inductor L has elapsed (Step S106). In a case where the peak of the voltage value generated by the control piezoelectric device 110 has not been detected (S100: No), the process waits until the peak of the voltage value generated by the control piezoelectric device 110 is detected.

As a result, in a case where it is determined that a time of ½ of the resonance period has not elapsed (Step S106: No), the same determination is repeated, whereby a standby state is formed until the time of ½ of the resonance period elapses. When it is determined that the time of ½ of the resonance period has elapsed (Step S106: Yes), the switch SW of the resonance circuit is turned off (Step S108). Thereafter, the process is returned to the start of the switch control process, and the above-described series of the process is repeated.

By turning the switch SW of the resonance circuit on or off as above, the switch SW can be turned on or off at appropriate timing in accordance with the movement of the crossbeam 104, whereby power can be efficiently generated by using the power generating device 100.

B. Second Embodiment

In the power generating device 100 of the first embodiment described above, only one control piezoelectric device 110 is described. However, the number of the control piezoelectric devices 110 is not necessarily limited to one, and a plurality of control piezoelectric devices may be provided. Hereinafter, such a second embodiment will be described. In the second embodiment, the same reference numeral is assigned to each configuration that is the same as that of the first embodiment, and a detailed description thereof will not be presented.

Figure 7A:
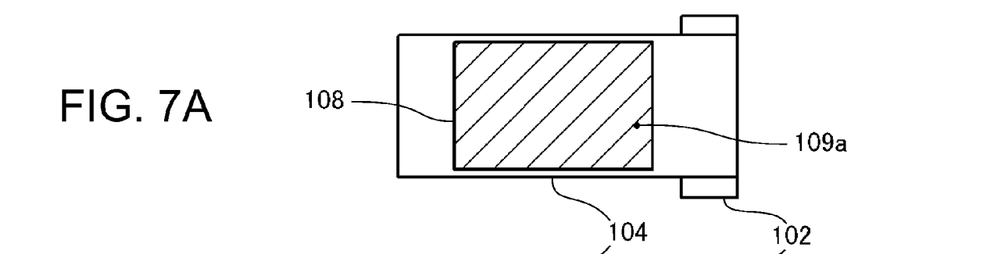
FIGS. 7A to 7C are explanatory diagrams illustrating the structure of a power generating device according to a second embodiment.
Figure 7B:
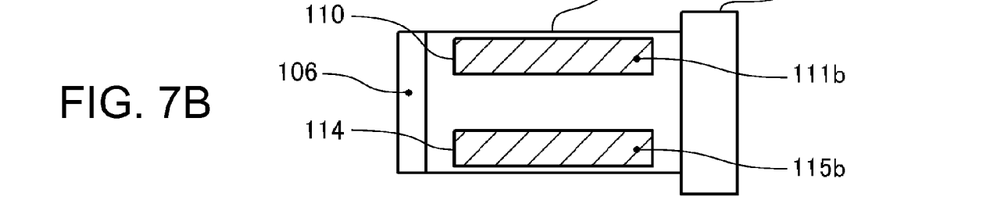

FIGS. 7A to 7C are explanatory diagrams illustrating a power generating device 100, which includes control piezoelectric devices, according to a second embodiment. FIG. 7A is a plan view viewed from one face of a crossbeam 104. FIG. 7B is a plan view viewed from the other face of the crossbeam 104. In FIG. 7A, a power generation piezoelectric device 108 disposed on one face of the crossbeam 104 is represented. In FIG. 7B, two control piezoelectric devices (a piezoelectric device 110 and a piezoelectric device 114) are disposed on the other face of the crossbeam 104. As is apparent from comparison between FIGS. 7A and 7B, while the length (the length in the longitudinal direction of the crossbeam 104) of the control piezoelectric devices 110 and 114 is the same as that of the power generation piezoelectric device 108, the width (the length in the short side direction of the crossbeam 104) of the control piezoelectric devices 110 and 114 is smaller than a half of the width of the power generation piezoelectric device 108. The two control piezoelectric devices 110 and 114 are disposed at positions approaching both sides of the crossbeam 104 in the widthwise direction. In the piezoelectric device 114, similarly to the piezoelectric device 108 and the piezoelectric device 110, an upper electrode 115a and a lower electrode 115b are each formed by metal foils.

In a case where the power generation piezoelectric device 108 has a maximum length and a maximum width that can be installed to the crossbeam 104, the amount of power generation of the power generation piezoelectric device 108 is large, and, in a case where the control piezoelectric devices 110 and 114 respectively have a minimum installable width (the length in the short side direction of the crossbeam 104), the displacement resistance of the crossbeam 104 decreases owing to the control piezoelectric devices 110 and 114, thereby improving the efficiency of power generation.

By disposing two control piezoelectric devices 110 and 114 at positions approaching both sides of the crossbeam 104 in the widthwise direction, even in a case where the crossbeam 104 has different displacements for the upper side, the lower side, the left side, and the right side, the control piezoelectric devices 110 and 114 can turn the switch SW on or off at appropriate timing, and accordingly, the power generating device 100 can be used at various places.

Figure 7C:
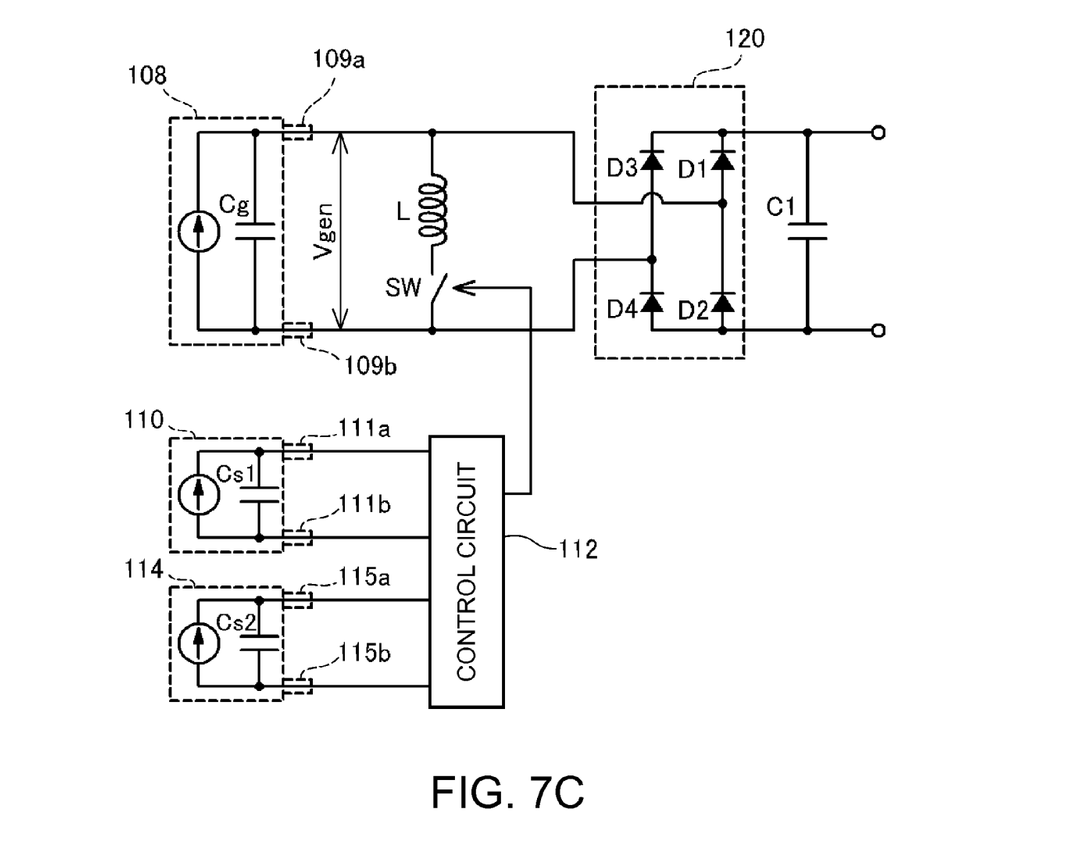

FIG. 7C is a circuit diagram of the power generating device 100, which has the two control piezoelectric devices 110 and 114, according to the second embodiment. The first control piezoelectric device 110 is represented as combination of a current source and a capacitor Cs1 that stores electric charge, and the second control piezoelectric device 114 is represented as combination of a current source and a capacitor Cs2 that stores electric charge. The upper electrode 111a and the lower electrode 111b of the first control piezoelectric device 110 are connected to a control circuit 112, and the upper electrode 115a and the lower electrode 115b of the second control piezoelectric device 114 are also connected to the control circuit 112.

The control circuit 112 selects one of a set of the upper electrode 111a and the lower electrode 111b and a set of the upper electrode 115a and the lower electrode 115b and detects the voltage value of the piezoelectric device 110 or the piezoelectric device 114 that has been selected so as to control the switch SW. For example, when the power generating device 100 is disposed, the amount of power generation is measured in a case where power is generated by detecting the voltage value of the piezoelectric device 110 and in a case where power is generated by detecting the voltage value of the piezoelectric device 114. The piezoelectric device that has a higher amount of power generation is selected by using a switch disposed in the control circuit 112 or the like. In a case where one of the piezoelectric device 110 or the piezoelectric device 114 is selected in advance, by performing the switch control process described with reference to FIG. 6, the switch SW can be controlled so as to be on or off.

Although two piezoelectric devices 110 and 114 generate approximately same voltage waveforms, there may be small differences in the voltage waveforms and the magnitudes of the voltage amplitudes due to the structure of the crossbeam 104, manufacturing variations, or the like. When there is a difference in the voltage waveforms, there is a possibility that there is a difference in the amount of power generation, and, in a case where there is a difference in the magnitudes of the voltage amplitudes, there is a possibility that the switch SW can be controlled at more appropriate timing by using one piezoelectric device (one that has higher sensitivity as a sensor) from which a larger voltage amplitude can be acquired. Thus, the amounts of power generation in a case where power is generated by detecting the voltage value of the piezoelectric device 110 and in a case where power is generated by detecting a voltage value of the piezoelectric device 114 are measured in advance, and the piezoelectric device having a larger amount of power generation is selected, whereby power can be generated with higher efficiency.

In the description presented above, one of the set (the upper electrode 111a and the lower electrode 111b) of terminals of the piezoelectric device 110 side and the set (the upper electrode 115a and the lower electrode 115b) of terminals of the piezoelectric device 114 side is selected and is used for controlling the switch SW. However, the switch SW may be controlled by connecting the upper electrode 111a and the upper electrode 115a and the lower electrode 111b and the lower electrode 115b and detecting an electric potential difference (voltage value) between the upper electrode side and the lower electrode side. For controlling the switch SW, the switch controlling process described above with reference to FIG. 6 can be applied.

Due to the influence of the structure of the crossbeam 104, environments in which the power generating device 100 is installed, or the like, deformation for twisting the crossbeam 104 may occur. In a case where the crossbeam 104 is twisted, the phase of the voltage waveform generated by the piezoelectric device 110 or the piezoelectric device 114 may be shifted. However, as shown in FIG. 7B, in a case where the piezoelectric device 110 and the piezoelectric device 114 are arranged so as to approach both sides in the widthwise direction of the crossbeam 104, the effects of twisting for bending the crossbeam 104 are reversed. Accordingly, by connecting the upper electrode 111a and the upper electrode 115a and connecting the lower electrode 111b and the lower electrode 115b, the influence of the twist of the crossbeam 104 on the piezoelectric device 110 and the piezoelectric device 114 can be eliminated. As a result, even in a case the crossbeam 104 is twisted, the switch SW can be controlled at appropriate timing without being influenced by the effect of the twist, whereby power can be efficiently generated.

C. Alternative Embodiments

There are various alternative embodiments which may be used in association with the first and second embodiments described above. Hereinafter, such alternative embodiments will be briefly described.

C-1. First Alternative Embodiment

In the above-described second embodiment, it has been described that two control piezoelectric devices 110 and 114 respectively have a same length as the power generation piezoelectric device 108, and the control piezoelectric devices 110 and 114 are disposed at positions approaching both ends in the widthwise direction of the crossbeam 104. However, two piezoelectric devices 110 and 114 that are respectively shorter than half the length of the power generation piezoelectric device 108 may be arranged so as to be aligned in one row toward the longitudinal direction at the center position of the crossbeam 104.

Figure 8A:
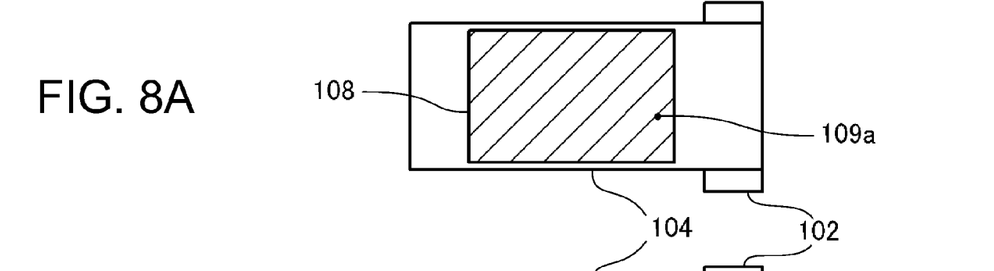
FIGS. 8A and 8B are explanatory diagrams illustrating a first alternate embodiment in which a power generation piezoelectric device and two control piezoelectric devices are disposed.
Figure 8B:
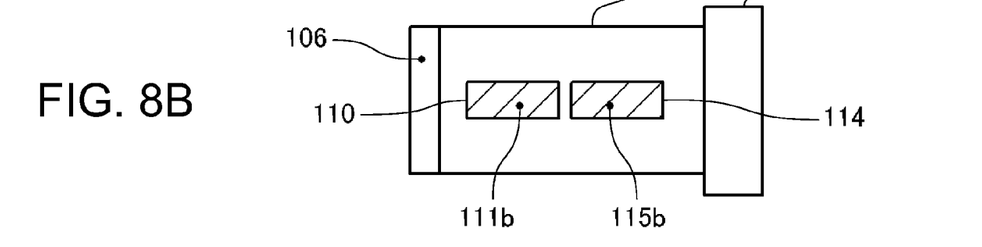

FIGS. 8A and 8B are explanatory diagrams illustrating the appearance in which a power generation piezoelectric device 108 and two control piezoelectric devices 110 and 114 are disposed in the crossbeam 104 of the power generating device 100 of the first alternative embodiment. FIG. 8A is a plan view viewed from one face of the crossbeam 104. FIG. 8B is a plan view viewed from the other face of the crossbeam 104. In FIG. 8A, the appearance of installation of the power generation piezoelectric device 108 is shown. In addition, in FIG. 8B, the appearance of installation of two control piezoelectric devices 110 and 114 is shown.

Depending on the structure of the crossbeam 104 and the influence of environments in which the power generating device 100 is installed, deformation for rippling the crossbeam 104 may occur. Then, there are a spot at which deformation increases and a spot at which deformation decreases in the longitudinal direction of the crossbeam 104 in a case where the crossbeam 104 is bent. Accordingly, as shown in FIG. 8B, by arranging two short piezoelectric devices 110 and 114 in one row along the longitudinal direction at the center of the crossbeam 104 and selecting the piezoelectric device that generates a voltage waveform having a sufficient amplitude, even in a case where the crossbeam 104 is deformed so as to ripple, the switch SW can be controlled at appropriate timing.

By connecting the upper electrode 111a and the upper electrode 115a and connecting the lower electrode 111b and the lower electrode 115b, the effect of the deformation of the crossbeam 104 so as to ripple can be eliminated. As a result, even in a case where the crossbeam 104 is deformed so as to ripple, the switch SW can be controlled at appropriate timing without being influenced by the effect thereof.

In the case shown in FIGS. 8A and 8B, although two piezoelectric devices including the piezoelectric device 110 and the piezoelectric device 114 are described to be disposed, three or more piezoelectric devices may be disposed.

C-2. Second Alternative Embodiment

In the above-described various embodiments or the first alternative embodiment, the control piezoelectric device 110 (and the piezoelectric device 114) are described to be disposed on a face other than the face on which the power generation piezoelectric device 108 is disposed. However, the control piezoelectric device 110 may be disposed on the face on which the power generation piezoelectric device 108 is disposed.

Figure 9:
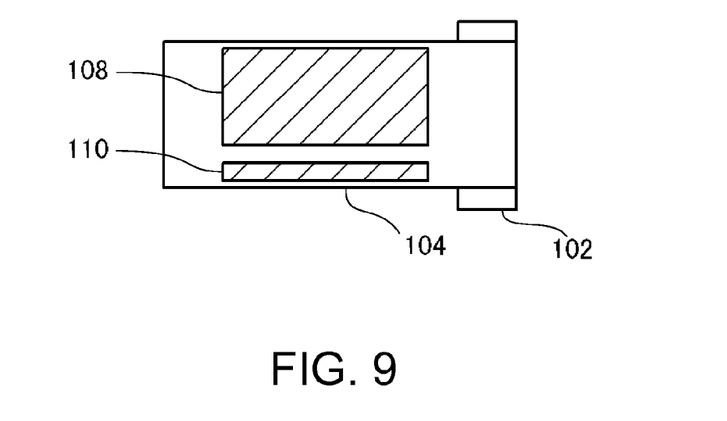
FIG. 9 is an explanatory diagram illustrating a second alternative embodiment in which a power generation piezoelectric device and a control piezoelectric device are disposed on a same face of a crossbeam.

FIG. 9 is an explanatory diagram illustrating the appearance in which the power generation piezoelectric device 108 and the control piezoelectric device 110 are disposed on the same face of the crossbeam 104 of a power generating device 100 according to a second alternative embodiment. In the example shown in FIG. 9, the power generation piezoelectric device 108 and the control piezoelectric device 110 are disposed on the same face of the crossbeam 104. While the control piezoelectric device 110 has the same length as the piezoelectric device 108, the width of the control piezoelectric device 110 is smaller than that of the piezoelectric device 108. As above, by arranging the control piezoelectric device 110 having almost the same length as the power generation piezoelectric device 108 so as to be parallel with the piezoelectric device 108, the piezoelectric device 108 and the piezoelectric device 110 are transformed in an approximately same manner. Accordingly, the switch SW can be controlled at appropriate timing by detecting the timing at which the displacement of the piezoelectric device 108 is at an extreme value with high accuracy.

In a case where the power generation piezoelectric device 108 and the control piezoelectric device 110 are disposed on the same face of the crossbeam 104, the size (area) of the power generation piezoelectric device 108 decreases by the size of the control piezoelectric device 110. As a result, similarly to the above-described various embodiments or the first alternative embodiment, the power generation capability is smaller than that of a case where the power generation piezoelectric device 108 and the control piezoelectric device 110 are disposed on different faces. However, as shown in FIG. 9, since the width of the control piezoelectric device 110 is small, the decrease in the area of the power generation piezoelectric device 108 can be suppressed to a relatively small value, whereby the decrease in the power generation capability can be relatively small.

On the other hand, similarly to the second alternative embodiment shown in FIG. 9, in a case where the power generation piezoelectric device 108 and the control piezoelectric device 110 are disposed on the same face, the piezoelectric device 108 and the piezoelectric device 110 can be arranged in the same process. In contrast to this, similarly to the above-described various embodiments or the first alternative embodiment, in a case where the power generation piezoelectric device 108 and the control piezoelectric device 110 are disposed on different faces, it is difficult to arrange the piezoelectric device 108 and the piezoelectric device 110 on the crossbeam 104 in the same process. Accordingly, the process of arranging the piezoelectric device 108 and the process of arranging the piezoelectric device 110 are arranged as separate processes. Therefore, similarly to the second alternative embodiment, by arranging the power generation piezoelectric device 108 and the control piezoelectric device 110 on the same face, the manufacturing process of the power generating device 100 can be efficiently performed. Conversely, similarly to the above-described various embodiments or the first alternative embodiment, in a case where the power generation piezoelectric device 108 and the control piezoelectric device 110 are disposed on different faces, although the manufacturing process of the power generating device 100 is complicated, the area of the power generation piezoelectric device 108 can be large, whereby the power generation capability can be increased.

As above, it is described that the control piezoelectric device 110 has almost the same length as the power generation piezoelectric device 108 but has a width smaller than the piezoelectric device 108. However, it may be configured such that a control piezoelectric device 110 that has almost the same width as the power generation piezoelectric device 108 but has a length smaller than the power generation piezoelectric device 108 is used, and the piezoelectric device 108 and the piezoelectric device 110 are disposed on the same face of the crossbeam 104.

Figure 10:
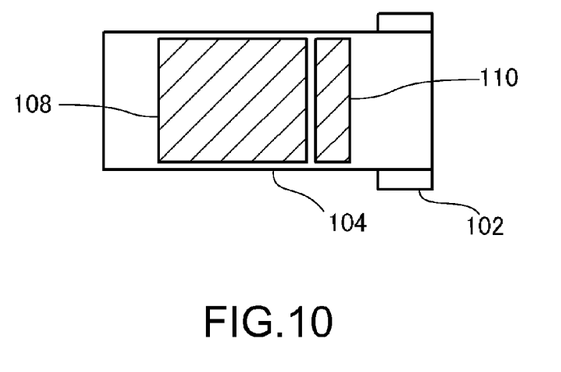
FIG. 10 is an explanatory diagram illustrating another form of the second alternative embodiment in which a power generation piezoelectric device and a control piezoelectric device are disposed on a same face of a crossbeam.

FIG. 10 is an explanatory diagram illustrating another form of the second alternative embodiment in which a power generation piezoelectric device 108 and a control piezoelectric device 110 are disposed on a same face of the crossbeam 104. In a cantilever such as a crossbeam 104, the bending moment increases from the tip end toward the support end 102, and accordingly, the amount of deformation of the crossbeam 104 per unit length increases. Accordingly, by disposing the control piezoelectric device 110 near the support end 102, the sensitivity as a sensor increases, and therefore the width of the control piezoelectric device 110 can be configured to be small. As a result, the area of the power generation piezoelectric device 108 can be large, whereby a decrease in the power generation capability due to the arrangement of the power generation piezoelectric device 108 and the control piezoelectric device 110 on the same face can be suppressed.

C-3. Third Alternative Embodiment

In the above-described second embodiment, it is described that the power generation piezoelectric device 108 and the control piezoelectric device 110 are disposed on the same face of the crossbeam 104, and only one control piezoelectric device 110 is disposed. However, even in a case where the power generation piezoelectric device 108 and the control piezoelectric device 110 are disposed on the same face of the crossbeam 104, a plurality of control piezoelectric devices may be disposed.

Figure 11:
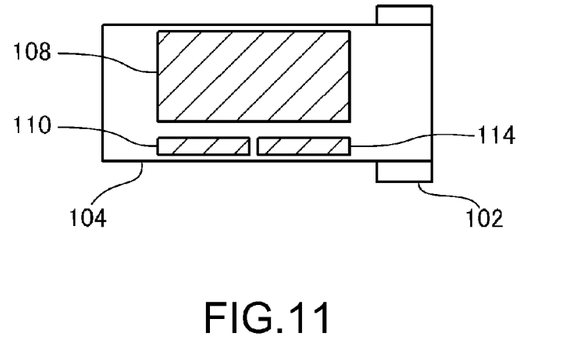
FIG. 11 is an explanatory diagram illustrating a third alternative embodiment in which a plurality of control piezoelectric devices are disposed on a face on which a power generation piezoelectric device is disposed.

FIG. 11 is an explanatory diagram illustrating a third alternative embodiment in which a plurality of control piezoelectric devices 110 and 114 is disposed on a face on which a power generation piezoelectric device 108 is disposed. In the example shown in the figure, the control piezoelectric devices 110 and 114 having a width smaller than the power generation piezoelectric device 108 and a length equal to or smaller than half the length of the power generation piezoelectric device 108 are aligned in one row and is disposed in parallel with the piezoelectric device 108.

As described above, depending on the structure of the crossbeam 104 or the environments in which the power generating device 100 is installed, the crossbeam 104 may be deformed so as to ripple. In such a case, a position at which the deformation is large in a case where the crossbeam 104 is bent and a position at which the deformation is small are generated along the longitudinal direction of the crossbeam 104. Accordingly, depending on the positions at which the control piezoelectric devices 110 and 114 are disposed, there is a case where sufficient sensitivity (a voltage value to be detected) cannot be acquired. Thus, as shown in FIG. 11, by disposing two short piezoelectric devices 110 and 114 in one row along the longitudinal direction of the crossbeam 104 and selecting a piezoelectric device from which sufficient sensitivity can be acquired, even in a case where the deformation of the crossbeam 104 so as to ripple occurs, the switch SW can be controlled at appropriate timing. It is apparent that the control piezoelectric devices are not limited to the two piezoelectric device 110 and the piezoelectric device 114, and thus three or more piezoelectric devices may be disposed.

By connecting the upper electrode 111a of the piezoelectric device 110 and the upper electrode 115a of the piezoelectric device 114 and connecting the lower electrode 111b of the piezoelectric device 110 and the lower electrode 115b of the piezoelectric device 114, and detecting an electric potential difference between the upper electrode side and the lower electrode side, the influence of the deformation of the crossbeam 104 so as to ripple can be eliminated. As a result, even in a case where the crossbeam 104 is deformed so as to ripple, the switch SW can be controlled at appropriate timing.

In the third alternative embodiment shown in FIG. 11, it is described that two short control piezoelectric devices 110 and 114 are deposed in one row in the longitudinal direction of the crossbeam 104. Accordingly, two short control piezoelectric devices 110 and 114 are disposed on one side of the power generation piezoelectric device 108. In contrast to this, the control piezoelectric devices 110 and 114 having almost the same length as the power generation piezoelectric device 108 and a width smaller than the power generation piezoelectric device 108 may be disposed on both sides of the power generation piezoelectric device 108.

Figure 12:
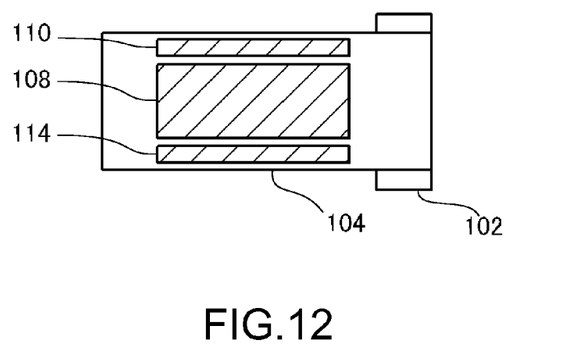
FIG. 12 is an explanatory diagram illustrating another form of the third alternative embodiment in which a plurality of control piezoelectric devices are disposed on a face on which a power generation piezoelectric device is disposed.

FIG. 12 is an explanatory diagram illustrating another form of the third alternative embodiment in which a plurality of control piezoelectric devices 110 and 114 is disposed on a face on which a power generation piezoelectric device 108 is disposed. As described above, due to the influence of the structure of the crossbeam 104, environments in which the power generating device 100 is installed, or the like, deformation for twisting the crossbeam 104 may occur. In a case where the crossbeam 104 is twisted, the phase of the voltage waveform generated by the piezoelectric device 110 or the piezoelectric device 114 may be shifted, whereby there may be a case where the switch SW cannot be switched at appropriate timing. However, as shown in FIG. 12, in a case where the piezoelectric device 110 and the piezoelectric device 114 having a small width are arranged on both sides of the power generation piezoelectric device 108, the amounts of power generation at the time of controlling the switch SW are measured by using the voltage values of the piezoelectric devices 110 and 114, and one of the piezoelectric devices 110 and 114 that has a larger amount of power generation is selected. In such a case, even when the crossbeam 104 is twisted, a decrease in the power generation capability can be decreased.

As shown in FIG. 12, by disposing the piezoelectric device 110 and the piezoelectric device 114, each having a small width, on both sides of the power generation piezoelectric device 108, the influence of the twist on the bend of the crossbeam 104 is reversed. Accordingly, by connecting the upper electrode 111a of the piezoelectric device 110 and the upper electrode 115a of the piezoelectric device 114 and connecting the lower electrode 111b of the piezoelectric device 110 and the lower electrode 115b of the piezoelectric device 114, the influence of the twist of the crossbeam 104 on the piezoelectric device 110 and the piezoelectric device 114 can be eliminated. As a result, even in a case the crossbeam 104 is twisted, the switch SW can be controlled at appropriate timing without being influenced by the effect of the twist, whereby power can be efficiently generated.

As above, although various embodiments and various alternative embodiments have been described, the invention is not limited thereto and can be performed in various forms within the scope not departing from the concept thereof.

For example, in the above-described embodiments, the piezoelectric device 108 is described to be installed to the crossbeam 104 having a cantilever structure. However, a member to which the piezoelectric device 108, the piezoelectric device 110, and the like are installed may be any member, as long as it can be repeatedly transformed easily in accordance with vibration or the like. For example, the piezoelectric device 108, the piezoelectric device 110, and the like may be installed on the surface of a thin film.

Since the power generating device according to the embodiment of the invention generates power in accordance with vibrations or movements, for example, in a case where the power generating device is disposed at a bridge, a building, or a place in which a landslide is expected, the power generating device may generate power at a disaster such as an earthquake and supply power to a network unit such as an electronic apparatus only when it is necessary (at the time of a disaster).

The application is not limited to electronic apparatuses, and, by using the power generating device according to the embodiment of the invention for a transportation apparatus such as a vehicle, subway, or the like, the power generating device may generate power in accordance with vibrations accompanied with the movement and supply power to the transportation apparatus with high efficiency.

What is claimed is:

1. A power generating device comprising:
   a transformation member that is transformed by receiving a transformation force in a transformation direction;
   a first piezoelectric device that is disposed on the transformation member;
   a second piezoelectric device that is disposed on the transformation member;
   an inductor comprising a resonance circuit which includes the first piezoelectric device;
   a switch that is disposed in the resonance circuit; and
   wherein the transformation member has a tip end and a support end;
   the first piezoelectric device is disposed closer to the support end than the second piezoelectric device;
   a control unit that controls the switch to be in a conductive state for a predetermined period by detecting a voltage generated in the second piezoelectric device as the second piezoelectric device is transformed in response to the transformation force being applied to the transformation member.

2. The power generating device according to claim 1, wherein the first piezoelectric device and the second piezoelectric device are disposed on different faces of the transformation member.

3. The power generating device according to claim 1, wherein the first piezoelectric device and the second piezoelectric device are disposed on a same face of the transformation member.

4. The power generating device according to claim 1, wherein an amount of power generation of the first piezoelectric device is larger than that of the second piezoelectric device.

5. The power generating device according to claim 1, wherein a plurality of the second piezoelectric devices is included in the transformation member.

6. An electronic apparatus comprising:
   the power generating device according to claim 1.

7. An electronic apparatus comprising:
   the power generating device according to claim 2.

8. An electronic apparatus comprising:
   the power generating device according to claim 3.

9. An electronic apparatus comprising:
   the power generating device according to claim 4.

10. An electronic apparatus comprising:
    the power generating device according to claim 5.

11. A transportation apparatus comprising:
    the power generating device according to claim 1.

12. A transportation apparatus comprising:
    the power generating device according to claim 2.

13. A transportation apparatus comprising:
    the power generating device according to claim 3.

14. A transportation apparatus comprising:
    the power generating device according to claim 4.

15. A transportation apparatus comprising:
    the power generating device according to claim 5.

* * * * *